United States Patent
Krishna

(10) Patent No.: US 6,731,917 B1
(45) Date of Patent: May 4, 2004

(54) METHOD AND APPARATUS FOR MINIMIZING IMAGE POWER IN THE OUTPUT OF A RECEIVER CIRCUIT

(75) Inventor: Kannan Krishna, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 522 days.

(21) Appl. No.: 09/670,209

(22) Filed: Sep. 25, 2000

Related U.S. Application Data

(60) Provisional application No. 60/163,364, filed on Nov. 3, 1999.

(51) Int. Cl.[7] .................................................. H04B 1/16
(52) U.S. Cl. .................... 455/205; 455/192.1; 455/208; 455/302; 455/313
(58) Field of Search .......................... 455/192.1, 192.2, 455/205, 208, 255, 256, 257, 259, 260, 264, 265, 296, 302, 303, 304, 313, 314, 315, 324; 375/44, 329

(56) References Cited

U.S. PATENT DOCUMENTS

| | | | |
|---|---|---|---|
| 5,398,002 A | * 3/1995 | Bang | ............................. 329/302 |
| 6,282,413 B1 | * 8/2001 | Baltus | ............................. 455/260 |
| 6,308,057 B1 | * 10/2001 | Hayashi | ........................ 455/324 |
| 6,356,594 B1 | * 3/2002 | Clement et al. | ............ 375/261 |
| 6,516,186 B1 | * 2/2003 | Yamagishi et al. | ......... 455/302 |

* cited by examiner

*Primary Examiner*—Quochien B. Vuong
(74) *Attorney, Agent, or Firm*—Carlton H. Hoel; W. James Brady; Frederick J. Telecky, Jr.

(57) ABSTRACT

A receiver system (10) includes a first stage of modulation (46, 51) which modulates a radio-frequency input signal (17), and a second stage of modulation (56, 61, 66, 71) which modulates outputs from the first stage. Combining circuits (76, 77) combine selected outputs of the second stage to produce two outputs (18, 19) from the receiver system. The first stage receives modulating signals (22, 23) from a first oscillator (21), and the second stage receives modulating signals (27, 28, 32, 33) from second and third oscillators (26, 31). The second and third oscillators each operate at a substantially lower frequency than the first oscillator. The phase difference between the modulating signals produced by each of the second and third oscillators is adjusted so that there is minimum image power in each of the system outputs (18, 19), even if the modulating signals from the first oscillator are not in phase quadrature.

3 Claims, 2 Drawing Sheets

METHOD AND APPARATUS FOR MINIMIZING IMAGE POWER IN THE OUTPUT OF A RECEIVER CIRCUIT

This application claims priority under 35 USC §119(e)(1) of provisional application No. 60/163,364 filed Nov. 3, 1999.

TECHNICAL FIELD OF THE INVENTION

This invention relates in general to a receiver circuit and, more particularly, to a method and apparatus for minimizing image power in the output of a receiver circuit.

BACKGROUND OF THE INVENTION

In receiver circuits which process radio frequency signals, it can be important to provide efficient image rejection, or in other words to ensure that each output from the receiver has minimum image power. One known image-rejection receiver includes a first modulation stage which has two mixers that each modulate a radio frequency input signal using a respective one of two modulating signals from a first oscillator, and a second modulation stage which has four mixers that each modulate the output of one of the mixers of the first stage using one of two modulating signals produced by a second oscillator. Two combining circuits then combine the outputs of respective pairs of the mixers in the second stage, in order to produce I and Q output signals from the receiver circuit.

Each of the two oscillators in this circuit has a phase adjustment portion, which allows adjustment of the phase difference between the two modulating signals produced by that oscillator. By appropriate adjustment of the phase difference in each oscillator, the two modulating signals from that oscillator can be maintained in phase quadrature with each other, which in turn results in minimum image power in each of the I and Q outputs, so that receiver circuit has good image rejection.

In this known circuit, however, the first oscillator operates a much higher frequency than the second oscillator, for example about five times the frequency of the second oscillator. It is known that, as the operating frequency of an oscillator increases, it becomes progressively more difficult to design phase adjustment circuitry which can accurately adjust a phase difference between two outputs from the oscillator. Accordingly, in this known type of receiver circuit, it is difficult and complex to design suitable phase adjustment circuitry for the first oscillator, which operates at a much higher frequency than the second oscillator.

SUMMARY OF THE INVENTION

From the foregoing, it may be appreciated that a need has arisen for a method and apparatus which permit a receiver system to minimize image power in an output, while avoiding the need to design phase adjustment circuitry for a high-frequency oscillator. According to the present invention, a method and apparatus are provided to address this need, and involve: generating first and second modulating signals at a first frequency and with a phase difference; generating third and fourth modulating signals at a second frequency and with a phase difference; generating fifth and sixth modulating signals at a third frequency and with a phase difference; generating intermediate signals in a first stage of modulation by using the first and second modulating signals to modulate an input signal; generating intermediate signals in a second stage of modulation by selectively using the third, fourth, fifth and sixth modulating signals to modulate the intermediate signals from the first stage of modulation; generating first and second output signals which are each a function of selected intermediate signals from the second stage of modulation; and controlling the phase difference between the third and fourth modulating signals and the phase difference between the fifth and sixth modulating signals so as to substantially avoid an image component in each of the first and second output signals.

BRIEF DESCRIPTION OF THE DRAWINGS

A better understanding of the present invention will be realized from the detailed description which follows, taken in conjunction with the accompanying drawings, in which.

DETAILED DESCRIPTION OF THE INVENTION

Figure 1:
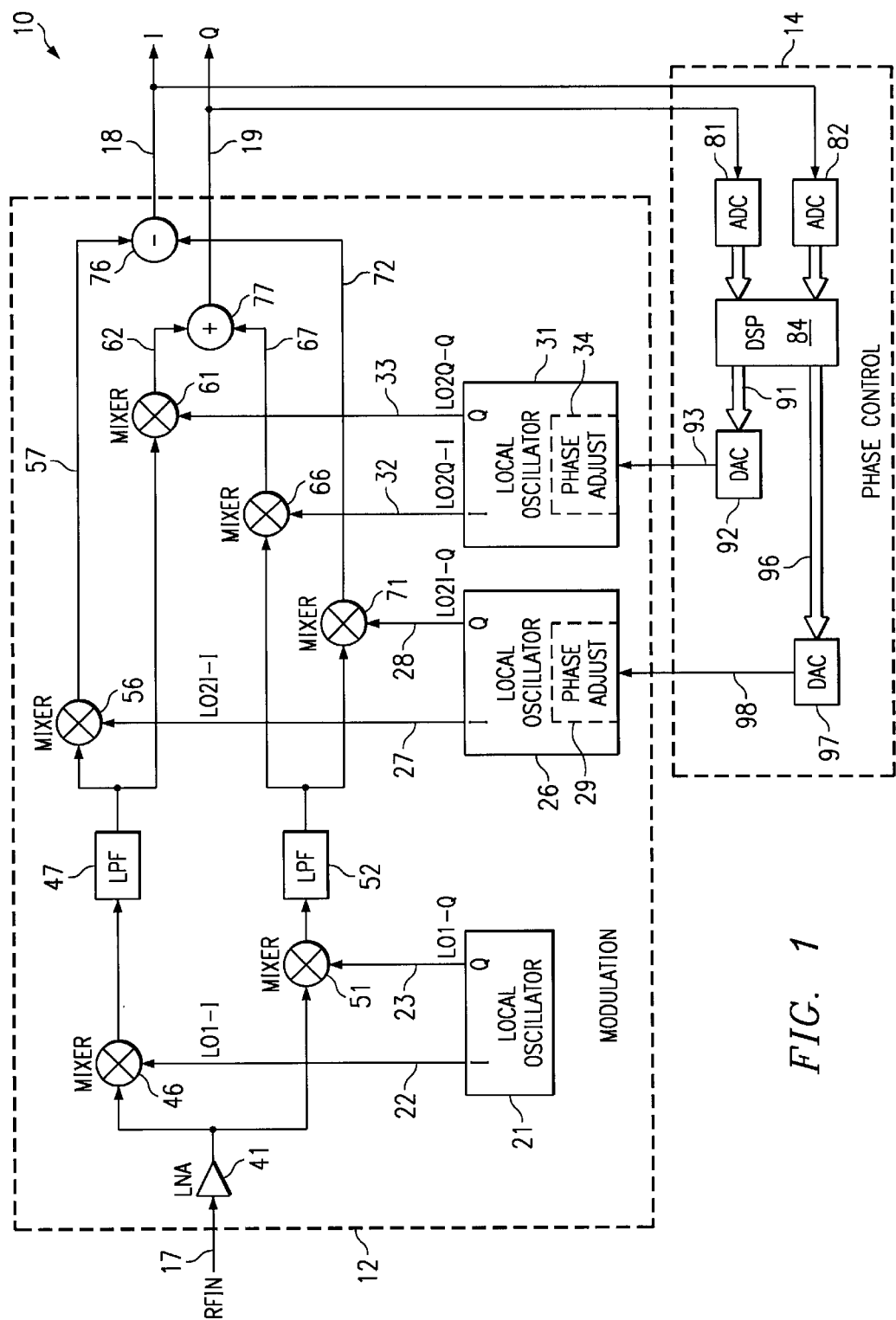
FIG. 1 is a block diagram of a receiver circuit which embodies the present invention.

FIG. 1 is a block diagram of a receiver system 10 which embodies the present invention, and which includes a modulation section 12 and a phase control section 14. The receiver system 10 receives a radio frequency (RF) input signal RFIN at 17, and generates I and Q output signals at 18 and 19.

The modulation section 12 includes a local oscillator 21, which produces an I modulating signal at 22, and a Q modulating signal at 23. In the disclosed embodiment, the modulating signals 22 and 23 are substantially identical sinusoidal signals at a predetermined frequency, but differ in phase by approximately 90°. Ideally, it would be desirable for the modulating signals 22 and 23 to be in precise phase quadrature, or in other words to have a phase difference of exactly 90°. In particular, this is desirable because it would facilitate good image rejection by the receiver system 10, or in other words minimum image power at each of the outputs 18 and 19. As a practical matter, however, this presents some difficulties. More specifically, the oscillator 21 is a relatively high frequency oscillator, and it is known in the art that it is much more difficult to design accurate phase adjustment circuitry for a high frequency oscillator than for a low frequency oscillator. A feature of the present invention, which is discussed in more detail later, is that phase adjustment circuitry is not needed for the high frequency oscillator 21, but that the receiver system 10 of FIG. 1 nevertheless provides excellent image rejection, even if the modulation signals 22 and 23 from the oscillator 21 are not in precise phase quadrature.

The modulation section 12 also includes a second oscillator 26, which produces an I modulating signal 27 and a Q modulating signal 28. The signals 27 and 28 are substantially identical sinusoidal signals at the same frequency, except that they have a phase difference of approximately 90°. The frequency of the modulating signals 27 and 28 is substantially less than the frequency of the modulating signals 22 and 23 from the oscillator 21, and in the disclosed embodiment is about one-fifth the frequency of the signals 22 and 23. The oscillator 26 includes a phase adjustment portion 29, which is capable of adjusting the phase difference between the modulating signals 27 and 28.

In addition to the first and second oscillators 21 and 26, the modulation section 12 includes a third local oscillator 31, which generates an I modulating signal 32 and a Q modulating signal 33. The modulating signals 32 and 33 are sinusoidal signals at the same frequency, but have a phase difference of approximately 90°. In the disclosed embodiment, the frequency of the modulating signals 32 and 33 is the same as the frequency of the modulating signals 27 and 28. The oscillator 31 includes a phase adjust portion 34, which can adjust the phase difference between the modulating signals 32 and 33.

The modulation section 12 includes a low noise amplifier (LNA) 41, which receives as an input at 17 the RF input signal RFIN. A mixer 46 has one input coupled to the output of the amplifier 41, and the other input coupled to the modulating signal 22. The mixer 46 uses the modulating signal 22 to modulate the output of amplifier 41, and the resulting modulated signal is then processed at 47 by a low pass filter (LPF). A further mixer 51 has one input coupled to the output of amplifier 41, and another input coupled to the modulating signal 23. The mixer 51 uses the modulating signal 23 to modulate the output of amplifier 41, and the resulting modulated signal is then processed by a LPF 52. The two mixers 46 and 51 thus provide a first stage or level of modulation in the modulation section 12.

The modulation section includes a further mixer 56, which has one input coupled to the output of LPF 47, and a second input coupled to the modulating signal 27 from oscillator 26. The mixer 56 uses modulating signal 27 to modulate the output signal from LPF 47, and outputs the resulting modulated signal at 57. A mixer 61 has one input coupled to the output of LPF 47, and a second input coupled to the modulating signal 33. The mixer 61 uses modulating signal 33 to modulate the output of LPF 47, and outputs the resulting modulated signal at 62.

A mixer 66 has one input coupled to the output of LPF 52, and its other input coupled to the modulating signal 32. The mixer 66 uses modulating signal 32 to modulate the output of LPF 52, and outputs the resulting modulated signal at 67. A mixer 71 has one input coupled to the output of LPF 52, and its other input coupled to the modulating signal 28. The mixer 71 uses the modulating signal 28 to modulate the output of LPF 52, and outputs the resulting modulated signal at 72. The four mixers 56, 61, 66 and 71 thus provide a second stage or level of modulation in the modulation section 12.

A difference circuit 76 has two inputs which are respective coupled to the outputs 57 and 72 of the mixers 56 and 71, and determines a difference between the output signals from these two mixers. The difference circuit 76 outputs the resulting difference signal on the line 18, to serve as the I output from the receiver system 10. A summation circuit 77 is responsive to the outputs 62 and 67 of the mixers 61 and 66, and determines a sum of the output signals from these two mixers. The summation circuit 77 outputs the resulting sum signal on the line 19, to serve as the Q output from the receiver system 10. Thus, the difference circuit 76 and the summation circuit 77 each function as a combining circuit, which combines selected outputs of the mixers 56, 61, 66 and 71 so as to produce a respective one of the two output signals 18 and 19.

In addition to the modulation section 12, and as mentioned above, the receiver system 10 includes the phase control section 14. In general, based on the output signals 18 and 19 of the receiver system 10, the phase control section 14 generates two phase control signals which are each supplied to the phase control input of a respective one of the oscillators 26 and 31.

In more detail, the phase control section 14 of the receiver system 10 includes two analog-to-digital converters (ADCs) at 81 and 82. The output lines 18 and 19 of the receiver system 10 are each coupled to the analog input of a respective one of the ADCs 81 and 82. The ADCs 81 and 82 each convert the associated analog input signal to a multi-bit digital output signal, which is supplied to a digital signal processor (DSP) 84. The structure and operation of the DSP 84 are known in the art, and therefore described only briefly here, to the extent necessary to facilitate an understanding of the present invention.

More specifically, the DSP 84 is responsive to the digital signal from ADC 81 for generating a multi-bit digital phase control signal 91, which is supplied to a digital-to-analog converter (DAC) 92. The DAC 92 converts the digital signal 91 to an analog phase control signal 93, which is supplied to and controls the phase adjust portion 34 of oscillator 41. In a similar manner, the DSP 84 is responsive to the multi-bit digital signal from ADC 82 for generating a further multi-bit digital phase control signal 96, which is supplied to a DAC 97. The DAC 97 converts the digital signal 96 into an analog phase control signal 98, which is supplied to and controls the phase adjust portion 29 of the oscillator 26.

Figure 2:
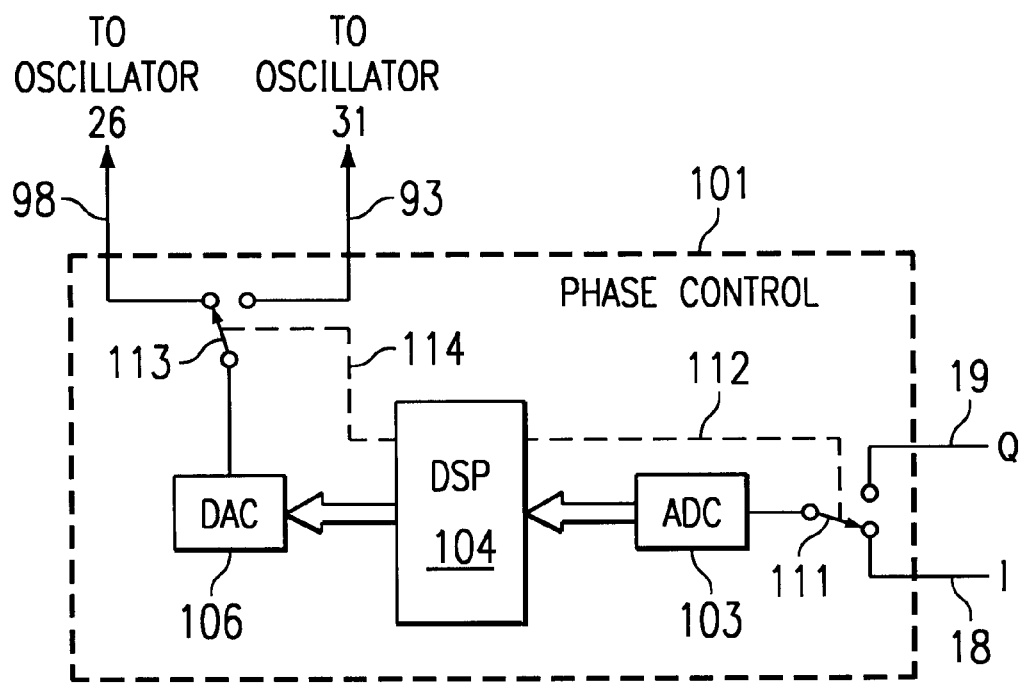
FIG. 2 is a block diagram of a phase control circuit, which is an alternative embodiment of a phase control circuit that is a component of the system of FIG. 1.

FIG. 2 is a block diagram of the circuitry of a phase control section 101, which is an alternative embodiment of the phase control section 14 shown in FIG. 1. The phase control section 101 includes an ADC 103 which outputs a multi-bit digital signal to a DSP 104, which in turn outputs a multi-bit digital signal to a DAC 106. An electronic switch 111 is provided to selectively couple the analog input of the ADC 103 to either the I output 18 or the Q output 19 of the receiver system 10. The switch 111 is controlled by the DSP 104, as indicated diagrammatically at 112.

The phase control section 101 also includes a further electronic switch 113, which can selectively supply the analog output signal from the DAC 106 to one of the phase control lines 98 and 93 associated with the oscillators 31 and 26. The switch 113 is controlled by the DSP 104, as indicated diagrammatically at 114. The DSP 104 controls the switches 111 and 113 in synchronism, so that the switches are both in the position shown in FIG. 2, or are both in the opposite position. Thus, at any point in time, the ADC 103, the DSP 104 and the DAC 106 are either generating a phase control signal 98 for the oscillator 26 based on the receiver output signal 18, or are generating a phase control signal 93 for the oscillator 31 based on the receiver output signal 19.

Figure 3:
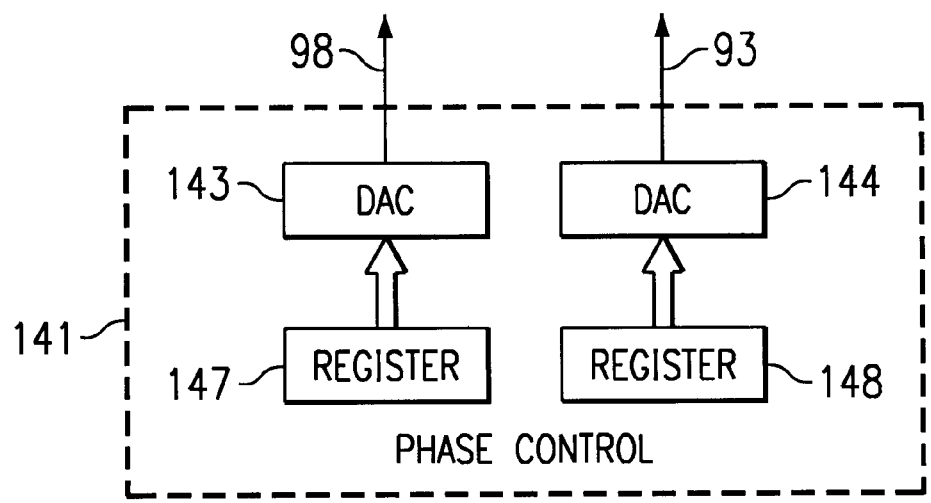
FIG. 3 is a block diagram of a phase control circuit, which is a further alternative embodiment of the phase control circuit of FIG. 1.

FIG. 3 is a block diagram of the circuitry of a phase control section 141, which is a further alternative embodiment of the phase control section 14 of FIG. 1. The phase control section 141 includes two DACs 143 and 144. The DACs 143 and 144 each produce a respective analog output signal which serves as a respective one the phase control signals 98 and 93. The DACs 143 and 144 each have a multi-bit digital input, which is coupled to the output of a respective one of two registers 147 and 148. At the end of the manufacturing process for the modulation section 12 of FIG. 1, some manufacturing tests are carried out, including operation of the modulation section 12 under known conditions while appropriate measurements are taken at the outputs 18 and 19 of the receiver system. These measurements then are used to determine an appropriate phase setting for each of the oscillators 26 and 31. The bits of each of the registers 147 and 148 are then permanently set, in a manner so that the DACs 143 and 144 output phase control signals 98 and 93 that cause the oscillators 26 and 31 to each output modulating signals which have a desired phase relationship.

The operation of the receiver system 10 of FIG. 1 will now be described. In general, the phase adjust portion 29 of the oscillator 26 is used to control the phase difference between the modulating signals 27 and 28, while the phase adjust portion 34 of the oscillator 31 is used to control the phase difference between the modulating signals 32 and 33, so as to compensate for any departure from phase quadrature of the modulating signals 22 and 23 from oscillator 21, thereby minimizing image power in each of the receiver output signals 18 and 19, or in other words imparting excellent image rejection to the operation of the receiver system 10. Since the mixers 56 and 71 that correspond to output 18 use modulating signals from the oscillator 26, while the mixers 61 and 66 that correspond to output 19 use modulating signals from a different oscillator 31, and since the phase relationship between the two modulating signals from each of the oscillators 26 and 31 can be independently controlled by their respective phase adjust portions 29 and 34, a phase adjust portion is not needed in the oscillator 21. Consequently, the design of the receiver system 10 is simplified, because it is difficult and complex to design a phase adjustment circuit for an oscillator (such as the oscillator 21) which operates at a relatively high frequency, whereas it is less difficult to provide phase adjustment capability in oscillators which operate at lower frequencies, such as the oscillators 26 and 31.

On a more detailed level, the operation of the receiver system 10 of FIG. 1 may be expressed mathematically, in the following manner. Assume that the six modulating signals produced by the three oscillators are as follows, where $\omega$ represents frequency, t represents time, and $\phi$ represents phase.

Signal 22: $\cos(\omega 1 * t + \phi 1)$
Signal 23: $\sin(\omega 1 * t + \phi 1 + \delta\phi 1)$
Signal 27: $\cos(\omega 2 * t + \phi 2)$
Signal 28: $\sin(\omega 2 * t + \phi 3 + \delta\phi 3)$
Signal 32: $\cos(\omega 2 * t + \phi 3)$
Signal 33: $\sin(\omega 2 * t + \phi 2 + \delta\phi 2)$ For simplicity, assume that are no gain mismatches in the various circuit paths of the receiver system 10. (Gain mismatches, if any, can be easily corrected through use of a limiter). In addition, assume that the radio frequency input signal RFIN at 17 is a sinusoidal input signal, as follows.

Signal 17: $\cos(\omega 0 * t)$

Given these parameters, the RF and image components of the I channel output at 18 will be as follows.

RF component:

$$((1+\cos(\delta\phi 1+\delta\phi 2))/4)*\cos((\omega 0-\omega 1-\omega 2)*t-\phi 1-\phi 2)+((\sin(\delta\phi 1+\delta\phi 2))/4)*\sin((\omega 0-\omega 1-\omega 2)*t-\phi 1-\phi 2)$$

Image component:

$$((1-\cos(\delta\phi 1-\delta\phi 2))/4)*\cos((\omega 0-\omega 1+\omega 2)*t-\phi+\phi 2)-((\sin(\delta\phi 1-\delta\phi 2))/4)*\sin((\omega 0-\omega 1+\omega 2)*t-\omega 1+\phi 2)$$

Similarly, the RF and image components of the Q channel output at 19 will be as follows.

RF component:

$$((\sin(\delta\phi 1)+\sin(\delta\phi 3))*\cos((\omega 0-\omega 1-\omega 2)*t-\phi 1-\phi 3))/4-((\cos(\delta\phi 1)+\cos(\delta\phi 3))*\sin((\omega 0-\omega 1-\omega 2)*t-\phi 1-\phi 3))/4$$

Image component:

$$((\sin(\delta\phi 1)+\sin(\delta\phi 3)*\cos((\omega 0-\omega 1+\omega 2)*t-\phi 1-\phi 3)/4+((\cos(\delta\phi 3)-\cos(\delta\phi 1))*\sin((\omega 0-\omega 1+\omega 2)*t-\phi 1+\phi 3))/4$$

From the foregoing equations, it can be seen that the image component for the I channel will be eliminated if $\delta\phi 1=\delta\phi 2$, or in other words if the phase difference between the modulating signals 27 and 28 from the second oscillator 26 is set to be equal to the phase difference between the modulating signals 22 and 23 of the first oscillator 21. Further, the image component for the Q channel will be eliminated if $\delta\phi 1=-\delta\phi 3$, or in other words if the phase difference between the modulating signals 32 and 33 from the second oscillator 26 is set to be equal and opposite to the phase difference between the modulating signals 22 and 23 of the first oscillator 21. Therefore, by appropriate adjustment of the phase relationship between the modulating signals 27 and 28 from the second oscillator 26, and appropriate adjustment of the phase relationship between the modulating signals 32 and 33 from the third oscillator 31, the image component can be effectively eliminated from each of the signals 18 and 19, even if the modulating signals 22 and 23 from the first oscillator 21 are not in phase quadrature. Elimination of these image components means that there is minimum image power in the I channel at 18 and minimum image power in the Q channel at 19, or in other words excellent image rejection by the receiver system 10.

The receiver system 10 operates in substantially the same manner if the phase control section 14 of FIG. 1 is replaced with either the phase control section 101 of FIG. 2 or the phase control section 141 of FIG. 3. Accordingly, a separate discussion of operation is not provided for the embodiments corresponding to FIGS. 2 and 3.

The present invention provides a number of technical advantages. One such technical advantage is the provision of a receiver system, for example an image-reject quasi-homodyne receiver system, which is insensitive to departure from phase quadrature of the I and Q modulating signals from the high-frequency oscillator used for modulation in a first modulation stage. By providing two separate oscillators of lower frequency for a second modulation stage, each of which has the capability to adjust the phase relationship between the two modulating signals it generates, compensation can be implemented in the second stage for any departure from phase quadrature of the two modulating signals from the high-frequency oscillator for the first stage, so as to provide minimum image power in each of the I and Q channel outputs of the receiver system.

A related advantage is that there is no need to provide phase compensation in the high-frequency oscillator which produces the modulating signals for the first modulation stage. This has the advantage of reducing the complexity of the circuit design process, because it is easier to implement phase adjustment in lower-frequency oscillators of the type used for the second stage than in higher-frequency oscillator of the type used for the first stage.

Although three embodiments have been illustrated and described in detail, it should be understood that various substitutions and alterations can be made therein without departing from the scope of the present invention. For example, in the disclosed embodiment, the oscillator which produces the modulating signals for the first modulation stage does not have any capability to facilitate a phase adjustment between its output signals. However, it would be possible to provide some capability for phase adjustment within this oscillator, such as a coarse level of phase adjustment. As another example, the disclosed embodiment includes a low noise amplifier before the first modulation stage, and low pass filters between the first and second modulation stages, but there are other circuit configurations which also fall within the scope of the present invention.

As another example, the disclosed embodiment uses two separate oscillators for the second modulation stage, but it will be recognized that these could be combined into a single oscillator circuit, as long as the appropriate phase adjustment capabilities exist with respect to the various modulating signals produced for the second modulation stage. It will also be recognized that direct connections disclosed herein could be altered, such that two disclosed components would be coupled to one another through one or more intermediate components, without being directly connected, while still realizing the present invention. Other substitutions and alterations are also possible without departing from the spirit and scope of the present invention, as defined by the following claims.

What is claimed is:

1. An apparatus comprising:
   a first signal generating circuit operable to generate first and second modulating signals at a first frequency, said first and second modulating signals having a phase difference;
   a second signal generating circuit operable to generate third and fourth modulating signals at a second frequency, and having a phase control portion operable to facilitate adjustment of a phase difference between said third and fourth modulating signals;
   a third signal generating circuit operable to generate fifth and sixth modulating signals at a third frequency, and having a phase control portion operable to facilitate adjustment of a phase difference between said fifth and sixth modulating signals;
   a first modulation stage operable to generate intermediate signals by using said first and second modulating signals to modulate an input signal;
   a second modulation stage operable to generate intermediate signals by selectively using said third, fourth, fifth and sixth modulating signals to modulate said intermediate signals from said first modulation stage;
   a combining section operable to generate first and second output signals which are each a function of selected said intermediate signals from said second modulation stage; and
   phase control circuitry operable to control said phase control portions of said first and second signal generating circuits so as to substantially avoid an image component in each of said first and second output signals;
   wherein said first modulation stage Includes a first modulating circuit which is operable to generate a first intermediate signal by using said first modulating signal to modulate the input signal, and a second modulating circuit which is operable to generate a second intermediate signal by using said second modulating signal to modulate the input signal, said first and second intermediate signals each being one of said intermediate signals generated by said first modulation stage;
   wherein said second modulation stage includes a third modulating circuit which is operable to generate a third intermediate signal by using said third modulating signal to modulate said first intermediate signal, a fourth modulating circuit which is operable to generate a fourth intermediate signal by using said fourth modulating signal to modulate said second intermediate signal, a fifth modulating circuit which is operable to generate a fifth intermediate signal by using said fifth modulating signal to modulate said second intermediate signal, and a sixth modulating circuit which is operable to generate a sixth intermediate signal by using said sixth modulating signal to modulate said first intermediate signal, said third, fourth, fifth, and sixth intermediate signals each being one of said intermediate signals generated by said second modulation stage;
   wherein said combining section includes a first combining circuit which is operable to generate said first output signal as a function of each of said third and fourth intermediate signals, and a second combining circuit which is operable to generate said second output signal as a function of each of said fifth and sixth intermediate signals;
   wherein said phase control circuitry controls said phase control portion of said second signal generating circuit so as to substantially avoid an image component in said first output signal, and controls said phase control portion of said third signal generating circuit so as to substantially avoid an image component in said second output signal; and
   wherein said phase control circuitry is responsive to said first output signal and controls said phase control portion of said second signal generating circuit as a function of said first output signal, and is responsive to said second output signal and controls said phase control portion of said third signal generating circuit as a function of said second output signal.

2. An apparatus comprising:
   a first signal generating circuit operable to generate first and second modulating signals at a first frequency, said first and second modulating signals having a phase difference;
   a second signal generating circuit operable to generate third and fourth modulating signals at a second frequency, and having a phase control portion operable to facilitate adjustment of a phase difference between said third and fourth modulating signals;
   a third signal generating circuit operable to generate fifth and sixth modulating signals at a third frequency, and having a phase control portion operable to facilitate adjustment of a phase difference between said fifth and sixth modulating signals;
   a first modulation stage operable to generate intermediate signals by using said first and second modulating signals to modulate an input signal;
   a second modulation stage operable to generate intermediate signals by selectively using said third, fourth, fifth and sixth modulating signals to modulate said intermediate signals from said first modulation stage;
   a combining section operable to generate first and second output signals which are each a function of selected said intermediate signals from said second modulation stage; and
   phase control circuitry operable to control said phase control portions of said first and second signal generating circuits so as to substantially avoid an image component in each of said first and second output signals;
   wherein said first modulation stage includes a first modulating circuit which is operable to generate a first intermediate signal by using said first modulating signal to modulate the input signal, and a second modulating circuit which is operable to generate a second intermediate signal by using said second modulating signal to modulate the input signal, said first and second intermediate signals each being one of said intermediate signals generated by said first modulation stage;
   wherein said second modulation stage includes a third modulating circuit which is operable to generate a third intermediate signal by using said third modulating signal to modulate said first intermediate signal, a fourth modulating circuit which is operable to generate a fourth intermediate signal by using said fourth modulating signal to modulate said second intermediate signal, a fifth modulating circuit which Is operable to generate a fifth intermediate signal by using said fifth modulating signal to modulate said second intermediate signal, and a sixth modulating circuit which is operable to generate a sixth intermediate signal by using said sixth modulating signal to modulate said first intermediate signal, said third, fourth, fifth, and sixth intermediate signals each being one of said intermediate signals generated by said second modulation stage;

wherein said combining section includes a first combining circuit which is operable to generate said first output signal as a function of each of said third and fourth intermediate signals, and a second combining circuit which is operable to generate said second output signal as a function of each of said fifth and sixth intermediate signals;

wherein said phase control circuitry controls said phase control portion of said second signal generating circuit so as to substantially avoid an image component in said first output signal, and controls said phase control portion of said third signal generating circuit so as to substantially avoid an image component in said second output signal; and wherein said phase control circuitry includes first and second digital-to-analog converters which each have a digital input to which it is applied a respective multi-bit digital control signal, and which have an analog output, said analog output of said first digital-to-analog converter being coupled to said phase control portion of said second signal generating circuit, and said analog output of said second digital-to-analog converter being coupled to said phase control portion of said third signal generating circuit.

3. A method comprising the steps of:

generating first and second modulating signals at a first frequency, said first and second modulating signals having a phase difference;

generating third and fourth modulating signals at a second frequency, said third and fourth modulating signals having a phase difference;

generating fifth and sixth modulating signals at a third frequency, said fifth and sixth modulating signals having a phase difference;

generating intermediate signals in a first stage of modulation by using said first and second modulating signals to modulate an input signal;

generating intermediate signals in a second stage of modulation by selectively using said third, fourth, fifth and sixth modulating signals to modulate said intermediate signals from said first stage of modulation;

generating first and second output signals which are each a function of selected said intermediate signals from said second stage of modulation; and controlling the phase difference between said third and fourth modulating signals and the phase difference between said fifth and sixth modulating signals so as to substantially avoid an image component in each of said first and second output signals;

wherein said step of generating said intermediate signals in said first stage of modulation includes the steps of generating a first intermediate signal by using said first modulating signal to modulate the input signal, and generating a second intermediate signal by using said second modulating signal to modulate the input signal, said first and second intermediate signals each being one of said intermediate signals generated in said first stage of modulation;

wherein said step of generating said intermediate signals in said second stage of modulation includes the steps of generating a third intermediate signal by using said third modulating signal to modulate said first intermediate signal, generating a fourth intermediate signal by using said fourth modulating signal to modulate said second intermediate signal, generating a fifth intermediate signal by using said fifth modulating signal to modulate said second intermediate signal, and generating a sixth intermediate signal by using said sixth modulating signal to modulate said first intermediate signal, said third, fourth, fifth and sixth intermediate signals each being one of said intermediate signals generated in said second stage of modulation;

wherein said step of generating said first and second output signals includes the steps of generating said first output signal as a function of each of said third and fourth intermediate signals, and generating said second output signal as a function of each of said fifth and sixth intermediate signals; and wherein said step of controlling the phase differences includes the steps of controlling the phase difference between said third and fourth modulating signals so as to substantially avoid an image component in said first output signal, and controlling the phase difference between said fifth and sixth modulating signals so as to substantially avoid an image component in said second output signal; and wherein said step of controlling the phase difference between said third and fourth modulating signals is carried out in response to and as a function of said first output signal, and wherein said step of controlling the phase difference between said fifth and sixth modulating signals is carried in response to and as a function of said second output signal.

* * * * *